United States Patent
Campardo et al.

(10) Patent No.: US 10,847,326 B2
(45) Date of Patent: *Nov. 24, 2020

(54) MICROELECTROMECHANICAL DEVICE, WHICH CAN BE USED AS NON-VOLATILE MEMORY MODULE OR RELAY, AND MEMORY INCLUDING A PLURALITY OF MICROELECTROMECHANICAL DEVICES

(71) Applicant: STMICROELECTRONICS S.r.l., Agrate Brianza (IT)

(72) Inventors: Giovanni Campardo, Bergamo (IT); Carlo Valzasina, Gessate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/453,737

(22) Filed: Jun. 26, 2019

(65) Prior Publication Data
US 2019/0318885 A1    Oct. 17, 2019

Related U.S. Application Data

(62) Division of application No. 15/470,431, filed on Mar. 27, 2017, now Pat. No. 10,381,173.

(30) Foreign Application Priority Data

Jul. 26, 2016    (IT) .................... 102016000078454

(51) Int. Cl.
*H01H 1/00* (2006.01)
*B81B 7/04* (2006.01)
(Continued)

(52) U.S. Cl.
CPC ......... *H01H 1/0036* (2013.01); *B81B 7/0003* (2013.01); *B81B 7/007* (2013.01);
(Continued)

(58) Field of Classification Search
CPC .............. H01H 1/0094; H01H 1/0036; H01H 59/0009; B81B 7/007
See application file for complete search history.

(56) References Cited

U.S. PATENT DOCUMENTS 6,441,405 B1    8/2002    Smith
6,650,527 B1    11/2003    Pinto
(Continued)

FOREIGN PATENT DOCUMENTS

WO    2008/039372 A2    4/2008

OTHER PUBLICATIONS

Ball, "Popular physics myth is all at sea," May 4, 2006, http://www.nature.com/news/2006/060501/full/news060501-7.html, download date Mar. 7, 2017, 3 pages.

(Continued)

*Primary Examiner* — Mushfique Siddique
(74) *Attorney, Agent, or Firm* — Seed Intellectual Property Law Group LLP (57) ABSTRACT

A microelectromechanical device, in particular a non-volatile memory module or a relay, comprising: a mobile body including a top region and a bottom region; top electrodes facing the top region; and bottom electrodes, facing the bottom region. The mobile body is, in a resting condition, at a distance from the electrodes. The latter can be biased for generating a movement of the mobile body for causing a direct contact of the top region with the top electrodes and, in a different operating condition, a direct contact of the bottom region with the bottom electrodes. In the absence of biasing, molecular-attraction forces maintain in stable mutual contact the top region and the top electrodes or, alternatively, the bottom region and the bottom electrodes.

20 Claims, 7 Drawing Sheets

(51) Int. Cl.
    *B81B 7/00*         (2006.01)
    *H01H 59/00*      (2006.01)
    *H01H 1/14*       (2006.01)

(52) U.S. Cl.
    CPC .............. *B81B 7/04* (2013.01); *H01H 1/0094* (2013.01); *H01H 59/0009* (2013.01); *B81B 2201/01* (2013.01); *B81B 2203/0118* (2013.01); *B81B 2207/01* (2013.01); *H01H 2001/0042* (2013.01); *H01H 2001/0068* (2013.01); *H01H 2001/0078* (2013.01); *H01H 2001/145* (2013.01)

(56) References Cited

U.S. PATENT DOCUMENTS

| | | | |
|---|---|---|---|
| 9,793,417 B2* | 10/2017 | Kim | H01L 29/0673 |
| 10,381,173 B2* | 8/2019 | Campardo | H01H 1/0094 |
| 2009/0078850 A1 | 3/2009 | Pinto | |
| 2009/0128221 A1 | 5/2009 | Kam et al. | |
| 2010/0061143 A1* | 3/2010 | Carley | B81C 1/00198 |
| | | | 365/154 |
| 2010/0237738 A1 | 9/2010 | Smith et al. | |
| 2011/0043960 A1 | 2/2011 | Ikehashi | |
| 2012/0138437 A1* | 6/2012 | Ng | H01H 1/0094 |
| | | | 200/181 |
| 2013/0020631 A1 | 1/2013 | Pott et al. | |
| 2014/0262707 A1* | 9/2014 | Pawashe | H01H 1/0094 |
| | | | 200/181 |
| 2014/0338074 A1 | 11/2014 | Aksyuk et al. | |
| 2017/0076822 A1 | 3/2017 | Caldeira et al. | |
| 2017/0200815 A1 | 7/2017 | Caldeira et al. | |
| 2018/0038692 A1 | 2/2018 | Prati et al. | |
| 2019/0301004 A1* | 10/2019 | Mayet | C23C 14/0036 |
| 2020/0082867 A1* | 3/2020 | Perrin | G11C 11/24 |

OTHER PUBLICATIONS

Bordag et al., "New developments in the Casimir effect," *Physics Reports 353*(2001): 1-205, 2000.

Buks et al., "Casimir force changes sign," *Nature 419*:119-120, 2002.

Buks et al., "Stiction, adhesion energy, and the Casimir effect in micromechanical systems," *Physical Review B 63*: pp. 033402-1-033402-4, 2001.

Klimchitskaya et al., "Experiment and theory in the Casimir effect," arXiv:quant-ph/0609145v1, Sep. 19, 2006, 26 pages.

Milonni, P. W., "The Quantum Vacuum—An Introduction to Quantum Electrodynamics," Academic Press, Inc., 1994, pp. 54-58, 97-98, and 219-227.

* cited by examiner

MICROELECTROMECHANICAL DEVICE, WHICH CAN BE USED AS NON-VOLATILE MEMORY MODULE OR RELAY, AND MEMORY INCLUDING A PLURALITY OF MICROELECTROMECHANICAL DEVICES

BACKGROUND

Technical Field

The present invention relates to a microelectromechanical device, in particular a non-volatile memory module (or cell) or a relay, and to a memory including a plurality of said microelectromechanical devices.

Description of the Related Art

Semiconductor memories may be divided into two major categories: volatile memories and non-volatile memories.

Volatile memories store a logic datum by storing an electrical quantity. Examples are memories of a SRAM type, or capacitive DRAMs.

Non-volatile memories typically exploit quantum effects for electronic storage (floating gate, hot-channel electrons, tunnel effect, etc.), or else permanent changes of state (e.g., phase-change memories—PCMs), or else controlled re-organization of the magnetic dipoles (magnetoresistive memories—AMRs), and others still.

BRIEF SUMMARY

At least some embodiments of the present disclosure include a microelectromechanical device, which can be used as non-volatile memory cell or as relay, and a memory including a plurality of microelectromechanical devices, alternative to memory cells and memories of a known type. In particular, the memory may exploit quantum effects for storing a logic datum.

According to the present invention, a microelectromechanical device and memory including a plurality of microelectromechanical devices are thus provided.

BRIEF DESCRIPTION OF THE SEVERAL VIEWS OF THE DRAWINGS

For a better understanding of the present invention, preferred embodiments thereof are now described, purely by way of non-limiting example and with reference to the attached drawings, wherein.

DETAILED DESCRIPTION

Figure 1:
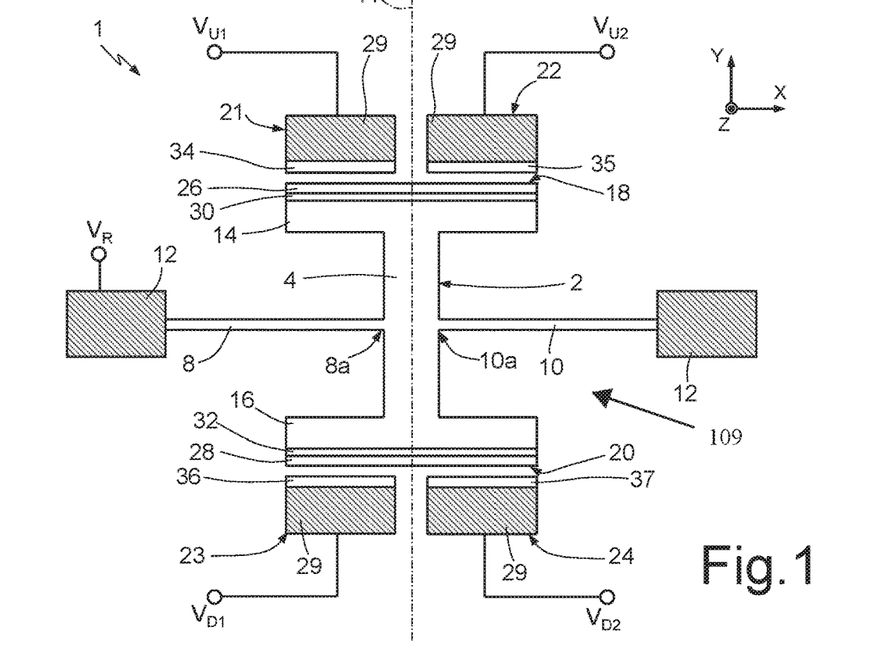
FIG. 1 shows, in a view in the plane XY, a microelectromechanical device according to one aspect of the present disclosure.

A microelectromechanical or MEMS device 1, according to one aspect of the present disclosure, is illustrated schematically in FIG. 1 in an XY plane of a triaxial reference system X, Y, Z.

In particular, the present description will make explicit reference to the use of the microelectromechanical device 1 as memory module, without this implying any loss of generality.

The memory module 1 comprises a mobile body 2, including a main portion 4, preferably of a rectangular shape, having main extension along the axis Y. The mobile body 2 is supported, via its main portion 4, by a first arm 8 and by a second arm 10. The first and second arms 8, 10 have a respective end 8a, 10a fixed with respect to the main portion 4, whereas the other end is fixed with respect to a substrate 12. The first and second arms 8, 10 extend in a main direction X, orthogonal to the direction Y. The first and second arms 8, 10 are moreover aligned along an axis of symmetry passing through the centroid of the mobile body 2.

The mobile body 2 moreover includes a top coupling portion 14 and a bottom coupling portion 16. The top coupling portion 14 is fixed with respect to a first end of the main portion 4 and extends as lateral prolongation thereof, i.e., in a view in the plane XY, principally in the direction X. In the plane XZ, the top coupling portion 14 forms a first plane surface 18.

Likewise, the bottom coupling portion 16 is fixed with respect to a second end of the main portion 4, opposite to the first end in the direction Y, and extends as lateral prolongation of the second end, i.e., in a view in the plane XY, principally in the direction X. In the plane XZ, the bottom coupling portion 16 forms a second plane surface 20.

In this context, by the term "plane surface" is meant a surface that has a surface roughness such as to enable an adequate mechanical coupling surface (for example, with a root-mean-square roughness lower than 100 nm RMS), i.e., such as to guarantee an electrical contact of an ohmic type and a sufficient force of adhesion, as described hereinafter.

The first and second plane surfaces 18, 20 face respective top electrode regions 21, 22 and bottom electrode regions 23, 24. The top and bottom electrode regions 21-24 are fixed, electrically insulated from one another (for example, physically separate, as illustrated in FIG. 1) and are designed to be biased at respective voltages $V_{U1}$, $V_{U2}$, $V_{D1}$, $V_{D2}$ by a voltage supply circuit (not shown in FIG. 1). The substrate 12, electrically coupled to the main portion 4 of the mobile body 2 via the first and second arms 8, 10 is at the reference voltage $V_R$ provided by the voltage supply circuit. Such a voltage supply circuit could be implemented by many know circuits, such a circuit including a voltage supply and a voltage divider with one or more taps that may provide the voltages described herein.

The first plane surface 18 can, thus, be electrostatically coupled to the top electrode region 21 and to the top electrode region 22. Likewise, also the second plane surface 20 can be electrostatically coupled to the bottom electrode region 23 and to the bottom electrode region 24.

According to one embodiment, the main portion 4 and the top and bottom coupling portions 14, 16 are made of semiconductor material. The top and bottom coupling portions 14, 16 are provided with a respective conductive surface layer (conductive layers 26, 28) made, for example, of metal material. The conductive layers 26, 28 extend over respective insulating layers 30, 32, made, for example, of silicon oxide, to be electrically insulated from the main portion 4, from the first and second arms 8, 10, and from the substrate 12.

The top electrode regions 21, 22 and bottom electrode regions 23, 24 are provided in respective portions, electrically insulated from one another, of a fixed body 29, which is also, for example, made of semiconductor material, such as silicon, and have, at respective surfaces facing the first and second plane surfaces 18, 20, respective conductive layers, made, for example, of metal material, designated by the reference numbers 34, 35, 36, and 37. The conductive layers 34, 35 belong, respectively, to the top electrode regions 21, 22 and extend over the portion of semiconductor material of the top electrode regions 21, 22 to be electrically coupled to the respective top electrode regions 21, 22. The conductive layers 36, 37 belong, respectively, to the bottom electrode regions 23, 24 and extend over the portion of semiconductor material of the bottom electrode regions 23, 24 to be electrically coupled to the respective bottom electrode regions 23, 24.

In other words, the conductive layers 34 and 35 directly face the conductive layer 26 of the mobile body 2, whereas the conductive layers 36 and 37 directly face the conductive layer 28 of the mobile body 2. The distance, measured along Y, of each of the conductive layers 34 and 35 from the conductive layer 26 is, in resting conditions (i.e., when no force acts on the mobile body 2), typically equal to the distance of each of the conductive layers 36 and 37 from the conductive layer 28.

In use, the memory module 1 can be used for writing and/or reading a logic datum "1" or "0" as a function of the voltages $V_{U1}$, $V_{U2}$, $V_{D1}$, $V_{D2}$ applied to the top and bottom electrode regions 21-24 and of the reference voltage $V_R$ at which the substrate 12 is biased. More in particular, a first operation of writing of a logic datum, e.g., "1", envisages application of voltages $V_{U1}$ and $V_{U2}$ such as to attract the mobile body 2 towards the top electrode regions 21, 22 (movement along Y), until a direct contact is obtained between the conductive layer 26 and the conductive layers 34, 35 (attraction by electrostatic force). The movement of the mobile body 2 along Y generates a deformation of the first and second arms 8, 10 and counters the force of return exerted by the first and second arms 8, 10, which tend to bring the mobile body 2 back into a position equally spaced from the top and bottom electrode regions 21-24 (force of elastic return).

However, forces of adhesion, which act at an atomic level, between the conductive layer 26 and the conductive layers 34, 35 in intimate contact with one another, oppose the force of elastic return. By balancing said forces, and in particular by designing the arms 8, 10 so that the force of elastic return exerted by them is lower than the aforementioned force of adhesion, it is obtained that the mobile body 2 maintains a first stable position of adhesion to the conductive layers 34, 35 even in the absence of the electrostatic forces generated by the voltages $V_{U1}$ and $V_{U2}$. Said first stable position can be associated to the first logic datum "1".

Likewise, a second operation of writing of a different logic datum, here "0", envisages application of voltages $V_{D1}$ and $V_{D2}$ such as to attract the mobile body 2 towards the bottom electrode regions 23, 24 (movement along Y), until a direct contact is obtained between the conductive layer 28 and the conductive layers 36, 37 (attraction by electrostatic force). The movement of the mobile body 2 along Y for writing the second logic datum "0" generates a deformation of the first and second arms 8, 10 that is opposite to the deformation that is obtained in the presence of writing of the first logic datum "1", but that likewise counters the force of return exerted by the first and second arms 8, 10, which tend to bring the mobile body 2 back into the resting position as a result of the force of elastic return. However, also in this case, forces of adhesion between the conductive layer 28 and the conductive layers 36, 37 in intimate contact with one another oppose the force of elastic return. By balancing said forces, and in particular by designing the arms 8, 10 so that the force of elastic return exerted thereby is lower than the force of adhesion between the conductive layer 28 and the conductive layers 36, 37, it is obtained that the mobile body 2 maintains a second stable position of adhesion to the conductive layers 36, 37 even in the absence of the electrostatic forces generated by the voltages $V_{D1}$ and $V_{D2}$. Said second stable position can thus be associated to the second logic datum "0".

The extent of the electrostatic force acting on the mobile body 2 is now evaluated. We assume, for this purpose, that we are in conditions of parallel plates (negligible fringing effect) and that the electrical resistance of the possible electrical interconnections is also negligible.

Figure 2:
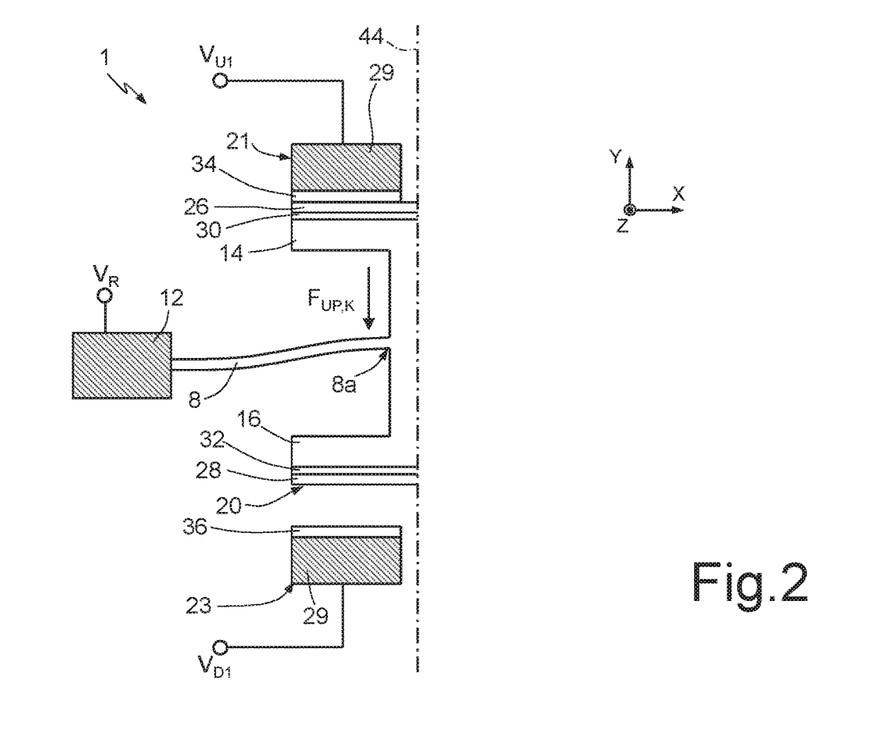
FIG. 2 shows a portion of the microelectromechanical device of FIG. 1.

FIG. 2 shows the left-hand half of the memory module 1 of FIG. 1, sectioned along a line of section 44 parallel to the axis Y and passing through the centroid of the main portion 4. The memory module 1 is symmetrical with respect to the line of section 44. The memory module 1 of FIG. 2 is in the operating condition of writing of the first logic datum.

The electrostatic force that acts against the action of the first arm 8 to attract the mobile mass 2 towards the first electrode 21 is given by $$F_{UP,U1} = \frac{1}{2}\left[\frac{\partial C}{\partial y}\right]^{UP}_{U1}(V_{U1} - V_R)^2 \qquad (1)$$

where the superscript "UP" identifies the position of the mobile mass 2, i.e., in contact with the top electrode 21, and the subscript "U1" identifies that this force is generated by the voltage $V_{U1}$ at which the top electrode 21 is biased.

The value of the capacitance C (capacitance between the top electrode 21 and the mobile mass 14) is given by $$C = \frac{\varepsilon_0 \varepsilon_r A}{g_0 - y} = \frac{\varepsilon_0 \varepsilon_r A}{g_{uu}} \qquad (2)$$

where $\varepsilon_0$ is the vacuum dielectric constant, $\varepsilon_r$ is the relative dielectric constant, A is the area of the conductive layer 34 set on the top electrode 21, $g_0$ is the gap between the top electrode 21 and the mobile mass 14 in resting conditions, y is the displacement of the mobile mass 2 along the axis Y in the direction of the top electrode 21, and $g_{uu}$ is the gap between the top electrode 21 and the mobile mass 14 in conditions of contact between the conductive layer 34 and the conductive layer 26 and has a value equal to the thickness of the insulating layer 30.

The electrostatic attractive force of the mobile mass 2 towards the top electrode 21 in conditions of logic state 1 is equal to the electrostatic force $F_{DW,D1}$ of attraction of the mobile mass 2 towards the bottom electrode 23 in the logic state 0, so that:

$$F_{UP,U1} = F_{DW,D1} = \frac{\varepsilon_0 \varepsilon_r A}{g_{uu}^2}(V_{U1} - V_R)^2 \quad (3)$$

When the mobile mass is in the operating condition of FIG. 2, one can send the device 1 into a condition of writing of the opposite logic datum, i.e., send the conductive layer 28 into contact with the conductive layer 36, by applying a force $F_{UP,D1}$ given by:

$$F_{UP,D1} = \frac{\varepsilon_0 \varepsilon_r A}{g_{ud}^2}(V_{D1} - V_R)^2 \quad (4)$$

where $g_{ud}$ is the distance between the bottom electrode 36 and the mobile mass 16 in conditions of contact between the conductive layer 34 and the conductive layer 26.

From Eqs. (3) and (4) it may be deduced that the parameter to be set to obtain the desired effect of attraction of the mobile body towards the top or bottom electrode is given by the voltages $V_{U1}$, $V_{D1}$, which are set case by case according to the passage between operating conditions that it is desired to obtain.

The elastic force $F_{UP,k1}$ generated by the first arm 8 is now evaluated, assuming that the first arm 8 is configured to behave as a linear elastic spring.

The elastic force $F_{UP,k1}$ that acts on the mobile body 2 attracting it towards the resting position when it is in the operating condition of FIG. 2, is given by $$F_{UP,k1} = -k_S\left(\frac{g_{uu} - g_{ud}}{2} - g_{uu}\right) = \frac{k_S}{2}(g_{ud} + g_{uu}) \quad (5)$$

where $k_S$ is the elastic constant of the spring provided by the first arm 8. It is evident that a similar elastic force $F_{DW,k1}$ acts on the mobile body 2 attracting it towards the resting position when it is in the operating condition of writing (or storing) of the logic datum opposite to that of FIG. 2 and has the same value as $F_{UP,k1}$, but opposite direction. Said elastic forces are exerted by both of the arms 8, 10.

The third force that acts between the conductive layers 26 and 34, in direct contact with one another, is an interatomic force, in particular the Casimir force, or Casimir effect.

The Casimir effect identifies the attractive force that is exerted between two bodies (for example, two conductive parallel plates). The attractive field between the bodies arises from the vacuum energy determined by virtual particles that are continuously created as a result of quantum fluctuations, according to what is envisaged by Heisenberg's uncertainty principle. The result of the presence of said attractive field is a net force that tends to push the two bodies against one another, and that can be measured. More in particular, the attractive force is given by the break in symmetry obtained by introducing the two surfaces (in the example of FIG. 2, the conductive layers 26 and 34 that form plates of a capacitor) to select, in the gap between the two surfaces, a number of energy modes, given by the aforesaid virtual particles, lower than the number of modes present outside the surfaces. The result is, precisely, a higher pressure on the outside than on the inside, which results in an attractive force between the two surfaces considered.

The Casimir force per unit surface ($F_C/A$), in the ideal case of perfectly conductive metal plates between which vacuum has been created, is computed as:

$$\frac{F_C}{A} = -\frac{\hbar c \pi^2}{240 d^4}$$

where:
 $\hbar$ is the reduced Planck constant ($1.054 \cdot 10^{-34}$ Js),
 c is the speed of light (300000 km/s),
 d is the distance between the directly facing surfaces of the two conductive plates ($g_{uu}$ or $g_{ud}$ in the previous examples), and
 A is the area of the facing surfaces of the conductive plates.

The value of the Casimir force is negative and indicates that its nature is attractive.

For example, in the case of plates set at the distance d of 1 μm, the resulting force per unit surface is 0.0013 N/m² (equivalent to 1.3 mPa).

The Casimir force is thus proportional to $A/d^4$. It is evident that bodies facing one another that have different shapes (or, rather, have a different value of the facing areas A) will consequently generate different Casimir forces. For distances between the two bodies that tend to zero (bodies in contact, d=0), an adhesion between them is generated.

The following table shows, by way of example, the intensity of the Casimir force ($F_C$) as compared to the electrostatic attractive force ($F_e$) in an example of plane parallel plates having a surface area A=20 nm² and a mutual distance d=1 nm, and illustrates how said forces have a comparable value for nanometric dimensions (A) of the bodies considered and of the distances (d) between them:

| $\|F_C\| = (\pi^2/240) \cdot$ (hc/d⁴) · A | $\|F_e\| = k_{el} q^2/d^2$ (where $k_{el}$ = 9 · $10^9$ Nm²/C²) |
|---|---|
| [(3.14²/240) · (1.054 · 10⁻³⁴ · 300 · 10⁶/(10⁻⁹)⁴)] · 400 · 10⁻¹⁸ = 5 10⁻⁷ N | 9 · 10⁹ · (3.5* 10⁻¹⁷)²/ (10⁻⁹)² = 31.5 10⁻⁷ N |

The example appearing in the table presupposes a value of capacitance C between the plane parallel plates equal to C=($\varepsilon_0 \varepsilon_r$A)/d=3.5 aF and a charge stored in the capacitor thus formed equal to Q=C·ΔV=3.5·10⁻¹⁷. The values appearing above were computed considering $\varepsilon_0$=8.85·10⁻¹² C²/m²N, $\varepsilon_r$=1(vacuum value), and

ΔV=10 V.

In the sequel of the treatment and with reference to FIG. 2, denoted by $F_{DW,D1,a}$ is the attractive molecular force (Casimir force) between the conductive layer 28 and the conductive layer 36, and denoted by $F_{UP,U1,a}$ is the attractive molecular force between the conductive layer 26 and the conductive layer 34. Neglecting possible undesirable differences in the physical and chemical structures of the conductive layers 26 and 34, due to the process of production thereof, it is assumed that $F_{UP,U1,a}$=$F_{DW,D1,a}$. It is moreover assumed that said forces will act only when the conductive layers 26 and 34 are in direct contact with one another, and do not have any significant effect when the conductive layers 26 and 34 are at a distance from one another.

Using the notation introduced previously, there now follows a description of the balancing of forces for an operation of reading of a logic datum stored by the memory module 1. In this example, the representation of the memory module 1 of FIG. 3 is considered, which is an overall view of what has already been illustrated in FIG. 2.

The operation of reading of the logic datum stored, i.e., detection of the position of the mobile body 2 with respect to the top and bottom electrodes 21-24, should not alter the logic datum stored, i.e., should not cause a displacement of the mobile body 2 with respect to the top and bottom electrodes 21-24. Reading is carried out by applying an appropriate voltage to the top and bottom electrodes 21-24 in order to verify at which of them there is an electrical contact with the mobile mass 2.

Figure 3:
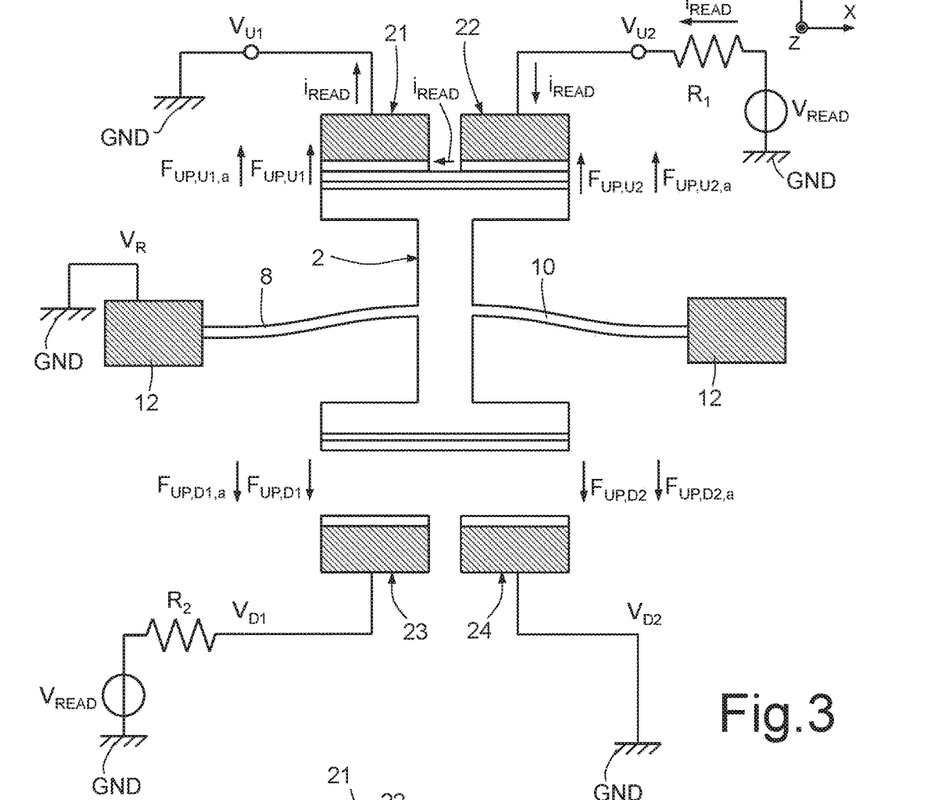
FIG. 3 illustrates the use of the microelectromechanical device of FIG. 1 as memory cell, during a step of reading of a stored logic datum.

In fact, as may be easily noted from FIG. 3, the mobile mass 2 closes the circuit formed by the top electrodes 21, 22 generating a passage of current $i_{read}$ through the resistor R1. The measurement of this current is an indication of the logic datum "1" stored in the memory module 1. At the same time, since the circuit formed by the bottom electrodes 23, 24 is open, there is no passage of current through the resistor R2, thus indicating that the memory module 1 is not storing the logic datum "0".

Application of the read voltage $V_{read}$ to the top electrode 22 and bottom electrode 23 is carried out at instants different from one another, for example in immediate temporal succession.

In order not to modify the logic datum stored in the memory cell 1, the sum of the forces of retention of the logic state "1" must be greater than the sum of the forces that tend to bring the mobile mass 2 into a resting state or into the opposite logic state ("0").

Figure 4:
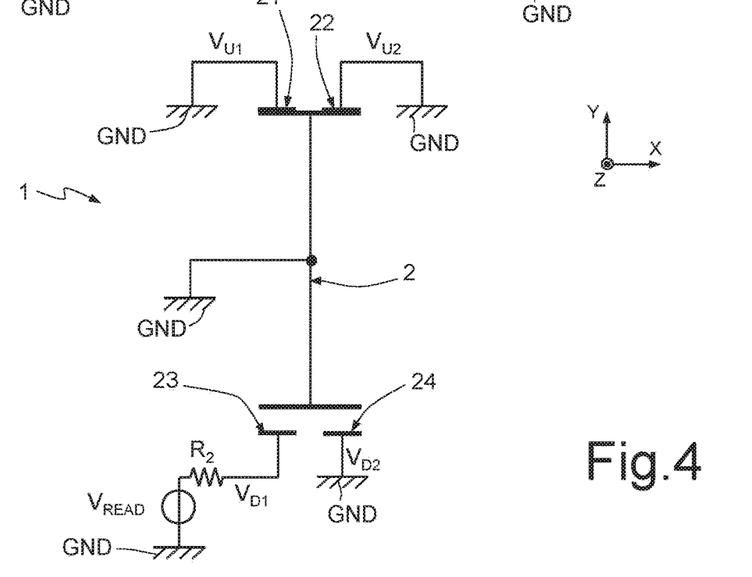
FIGS. 4-6 illustrates the use of the microelectromechanical device of FIG. 1 as memory cell, during respective operating steps.

With reference to FIG. 4, which is a schematic view of the memory module 1 of FIG. 3, the voltage $V_{U1}$ is set at ground value GND, or at a value close to ground GND, and also the voltage $V_{U2}$ is at ground value GND, or close to ground GND. The value of the substrate reference voltage $V_R$ is moreover set at ground value GND. In this context, the value of the ground voltage GND is 0 V, or close to 0 V. It is moreover assumed that the series resistance of the interconnections is negligible.

The voltage applied to the bottom electrode 24 is equal to the ground voltage GND, whereas the voltage applied to the bottom electrode 23 is the read voltage $V_{read}$, having a value different from 0 V, chosen as set forth in what follows.

In these conditions, it is expedient to balance the forces that act on the mobile mass 2 so that, when the read voltage is applied to the bottom electrode 23, there will not be any undesirable recession of the mobile mass 2 from the top electrodes 21, 22. In order not to modify the logic datum stored in the memory cell 1, the sum of the forces of retention of the logic state "1" should be greater than the sum of the forces that tend to bring the mobile mass 2 into a resting state or into the opposite logic state ("0").

We thus have that:

$$F_{UP,U1}+F_{UP,U2}+F_{UP,U1,a}+F_{UP,U2,a}>>F_{UP,D1}+F_{UP,D2}+F_{UP,D1,a}+F_{UP,D2,a}+F_{UP,k} \quad (6)$$

where: $F_{UP,U1}$ is the force exerted on the mobile mass 2 by the voltage $V_{U1}$ when the mobile mass is in the position of FIG. 3; $F_{UP,U2}$ is the force exerted on the mobile mass 2 by the voltage $V_{U2}$ when the mobile mass is in the position of FIG. 3; $F_{UP,U1,a}$ is the interatomic attractive force (Casimir force) acting between the top electrode 21 and the mobile mass 2 when the mobile mass is in the position of FIG. 3; $F_{UP,U2,a}$ is the interatomic attractive force (Casimir force) acting between the top electrode 22 and the mobile mass 2 when the mobile mass 2 is in the position of FIG. 3; $F_{UP,D1}$ is the force exerted on the mobile mass 2 by the voltage $V_{D1}$ when the mobile mass is in the position of FIG. 3 (here, the force exerted by the read voltage $V_{read}$); $F_{UP,D2}$ is the force exerted on the mobile mass 2 by the voltage $V_{D2}$ when the mobile mass is in the position of FIG. 3 (here, a zero force since $V_{D2}=0$ V); $F_{UP,D1,a}$ is the interatomic attractive force (Casimir force) acting between the bottom electrode 23 and the mobile mass 2 when the mobile mass is in the position of FIG. 3 (here, of a zero value); $F_{UP,D2,a}$ is the interatomic attractive force (Casimir force) acting between the bottom electrode 24 and the mobile mass 2 when the mobile mass is in the position of FIG. 3 (here, of a zero value); and $F_{UP,k}$ is the sum of the elastic forces exerted by the first arm 8 (elastic force $F_{UP,k1}$) and by the second arm 10 (elastic force $F_{UP,k2}$) when the mobile mass 2 is in the position of FIG. 3, and that tend to bring back the mobile mass 2 into the resting condition.

It thus follows, by introducing Eqs. (4) and (5) into Eq. (6), that:

$$F_{UP,U1,a}=F_{UP,U2,a}>>\frac{\varepsilon_0 A}{g_{ud}^2}V_{read}^2+\frac{k}{2}(g_{ud}+g_{uu}), \quad (7)$$

i.e., the intra- and inter-molecular attraction forces must be greater than the elastic and electrostatic forces in order not to modify the value of the logic datum stored by the device 1.

The threshold voltage $V_{th}$, beyond which the read operation becomes, in an undesired way, an operation of writing or erasure of the logic datum stored, is defined by $$V_{th}=\sqrt{\left(F_{UP,U1,a}+F_{UP,U2,a}-\frac{k}{2}(g_{ud}+g_{uu})\frac{2g_{ud}^2}{\varepsilon_0 A}\right)} \quad (8)$$

In conclusion, the read voltage $V_{read}$, applied to the bottom electrode 23 when the mobile mass 2 is in contact with the top electrodes 21 and 22, should satisfy the following relation in order not to modify the logic datum "1" stored:

$$V_{read}<<\sqrt{2}V_{th} \quad (9)$$

For example $V_{read}$ is 50% lower than $V_{th}$. Similar considerations apply, in a way in itself evident to the person skilled in the branch, for reading of the logic datum "0" when the mobile mass is in contact with the bottom electrodes 23, 24 and the read voltage is applied to one of the top electrodes, for example to the top electrode 22 as illustrated in FIG. 5.

Figure 5:
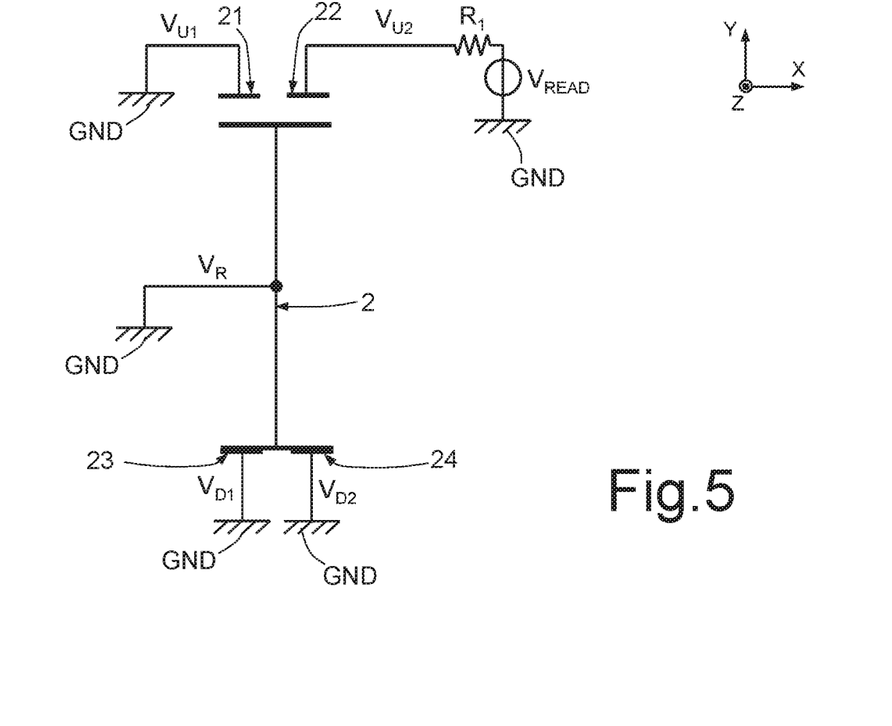

From what has been described previously, with reference to the read operation, it follows that, in order to carry out a write operation, i.e., for writing the logic datum "0" by moving the mobile mass 2 from the position of FIG. 4 to the position of FIG. 5 (where the conductive layer 28 is in direct contact with the conductive layers 36 and 37 of the bottom electrodes 23, 24), the voltage applied to the bottom electrodes 23, 24 is $V_{D1}=V_{write}$ and $V_{D2}=V_{write}$, where $V_{write}>>V_{th}$ (for example, $V_{write}=2V_{th}$).

The threshold voltage $V_{th}$ is a function of the constructional geometry of the memory module 1, according to what has been discussed previously with reference to the intensity of the Casimir force.

Similar considerations apply, in a way in itself evident to the person skilled in the branch, for writing of the logic datum "1" when the memory is, initially, in a state of storage of the logic datum "0".

Figure 6:
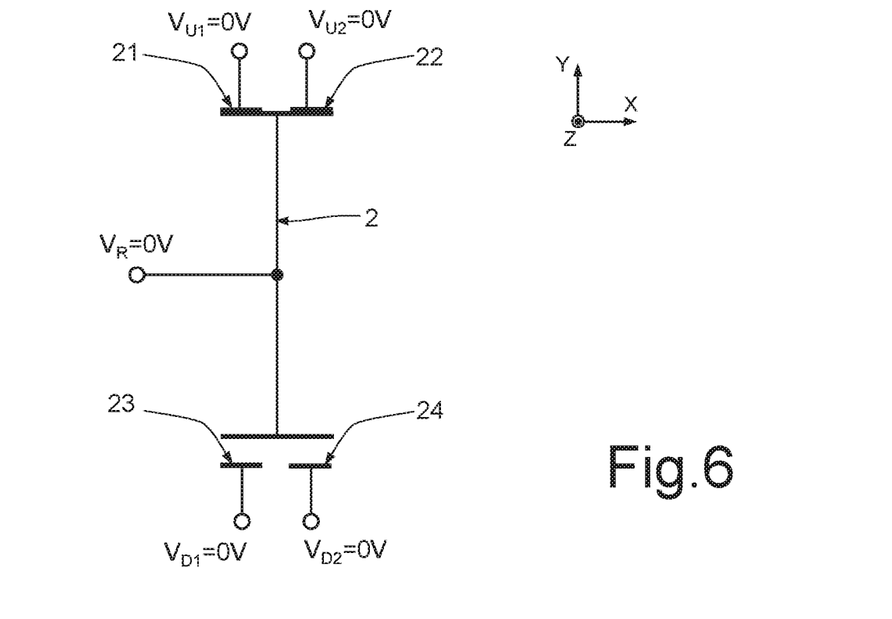

There is now defined the balancing of forces for keeping the mobile mass 2 in a stable position of storage of a logic datum, in particular, with reference to FIG. 6, of the logic datum "1". In this operating condition, the memory module 1 may be "off", i.e., the voltages $V_{U1}, V_{U2}, V_{D1}, V_{D2}, V_R$ are of a zero value. A non-volatile memory is thus implemented.

For maintaining the logic datum "1", i.e., the position of FIG. 6, the following relation should apply:

$$F_{UP,U1,a} \gg F_{UP,k} \tag{10}$$

i.e., $$F_{UP,U1,a} + F_{UP,U2,a} \gg \frac{k}{2}(g_{ud} + g_{uu}) \tag{11}$$

which is equivalent to $$F_{UP,U1,a} + F_{UP,U2,a} - \frac{k}{2}(g_{ud} + g_{uu}) \gg 0 \tag{12}$$

Comparing Eq. (12) with the term under square root in the formula of the threshold voltage $V_{th}$ (8), it directly follows that the threshold voltage $V_{th}$ must be real (i.e., the quantity under square root must be a positive number) in order to enable operation of the memory module 1 as non-volatile memory.

Similar considerations apply, in a way in itself evident to the person skilled in the branch, for maintaining of the logic datum "0".

According to an embodiment not illustrated in the figures, the elastic elements 8, 10 are provided according to a serpentine structure, i.e., bent a plurality of times. This embodiment of the elastic elements 8, 10 may be applied to each of the embodiments of the memory module described previously.

The present applicant has found that, by implementing a memory module 1 of dimensions, in the plane XY, of 250×250 μm², in particular with:

substantially rectangular elastic elements 8, 10 of dimensions, along Y and along Z, of 1.8 μm, bent 10 times, and of a length, along X, of 100 μm;

top and bottom electrodes with a square base surface and sides, along X and along Z, each of a length of 20 μm;

a thickness out of the plane (along Z) of the mobile body 2 of 24 μm;

gap, in resting conditions, between the conductive layer 34 and the conductive layer 26 of 1.1 μm; and thickness, along Y, of the insulating layer 30 of 0.5 μm, the threshold voltage $V_{th}$ is approximately 14V and it is possible to carry out read operations by applying a read voltage $V_{read}$ of 5 V and a write voltage $V_{write}$ of 20 V.

The present applicant has moreover noted that, implementing a memory module 1 of dimensions, in the plane XY, of 50×50 μm², in particular with:

substantially rectangular elastic elements 8, 10 with dimensions, along Y and along Z, of 0.4 μm, bent 4 times, and of a length, along X, of 15 μm;

top and bottom electrodes with square base surface and a side, along X and along Z, of a length of 5 μm each;

a thickness out of the plane (along Z) of the mobile body 2 of 1 μm;

gap in resting conditions between the conductive layer 34 and the conductive layer 26 of 0.06 μm; and thickness, along Y, of the insulating layer 30 of 0.05 μm, the threshold voltage $V_{th}$ is approximately 1.2 V, and it is possible to carry out read operations applying a read voltage $V_{read}$ of 0.6 V and a write voltage $V_{write}$ of 1.8 V.

In conclusion, by reducing the constructional dimensions, the performance tends to improve.

Manufacture of the memory module 1 can be carried out by deposition, photolithographic, and etching steps.

Figure 7:
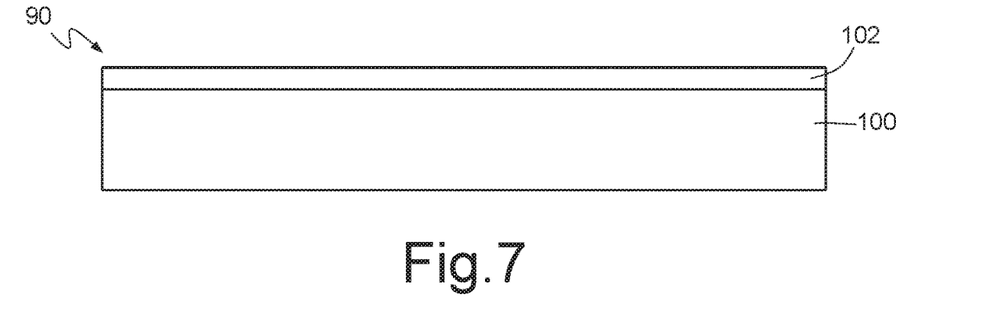
FIGS. 7-13 show manufacturing steps for the production of the microelectromechanical device of FIG. 1.

For example, with reference to FIG. 7, a wafer 90 is provided including a substrate 100, made of semiconductor material such as silicon. An insulating layer 102, for example silicon oxide, is then deposited over the wafer 90, on the substrate 100.

Figure 8:
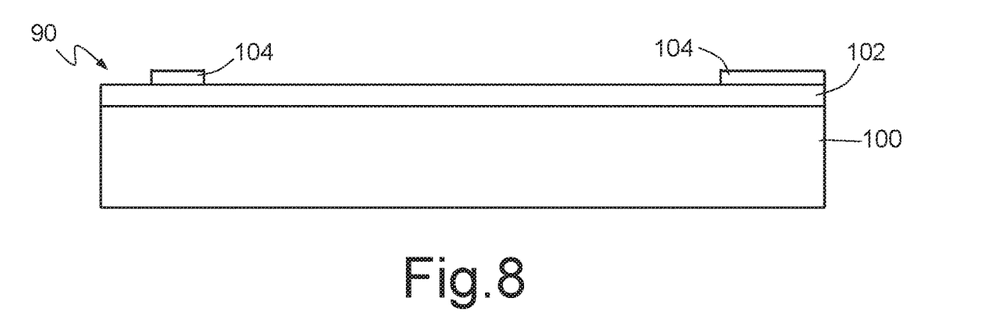

Then (FIG. 8), interconnection paths 104 are formed on the insulating layer, for example by depositing and photolithographically defining doped polysilicon. The interconnection paths 104 have, for example, the function of routing the electrical signals for biasing the top electrodes 21, 22 and bottom electrodes 23, 24, and the mobile body 2.

Figure 9:
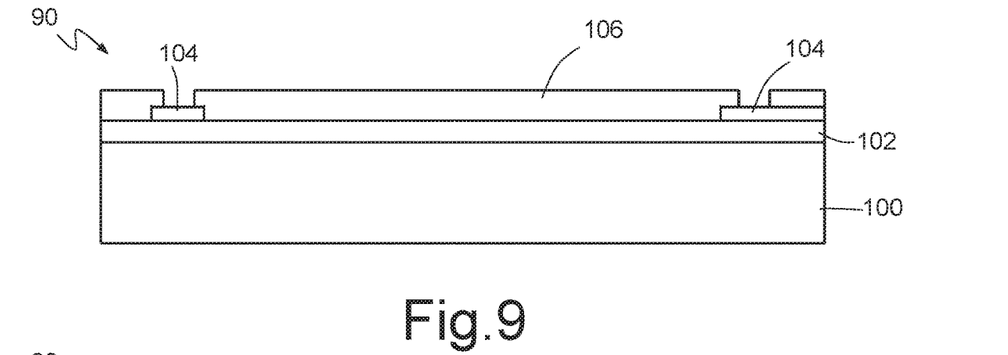

Then (FIG. 9), a sacrificial layer 106 is deposited, for example made of silicon nitride, over the wafer 90, covering the interconnection paths 104, and a selective etch of the sacrificial layer 106 is carried out in order to form trenches that expose selective surface regions of the interconnection paths 104.

Figure 10:
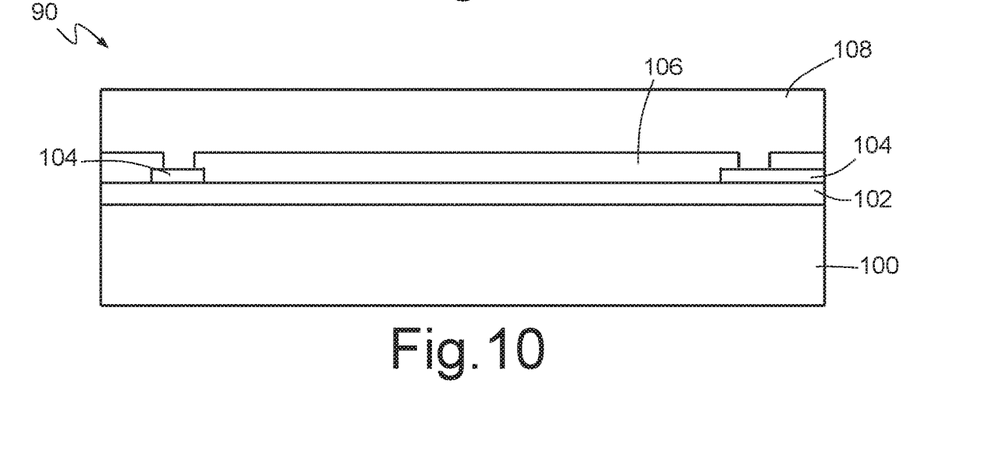

Then (FIG. 10), a step is carried out of growth of epitaxial silicon 108 on the wafer 90.

Figure 11:
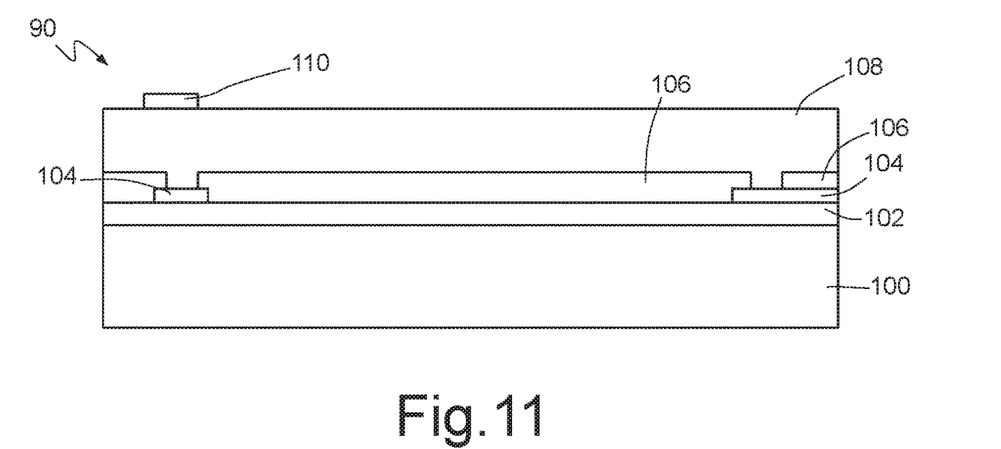

Optionally (FIG. 11), electrical contact pads 110, of metal material such as aluminum are formed on the epitaxial layer 108.

Figure 12:
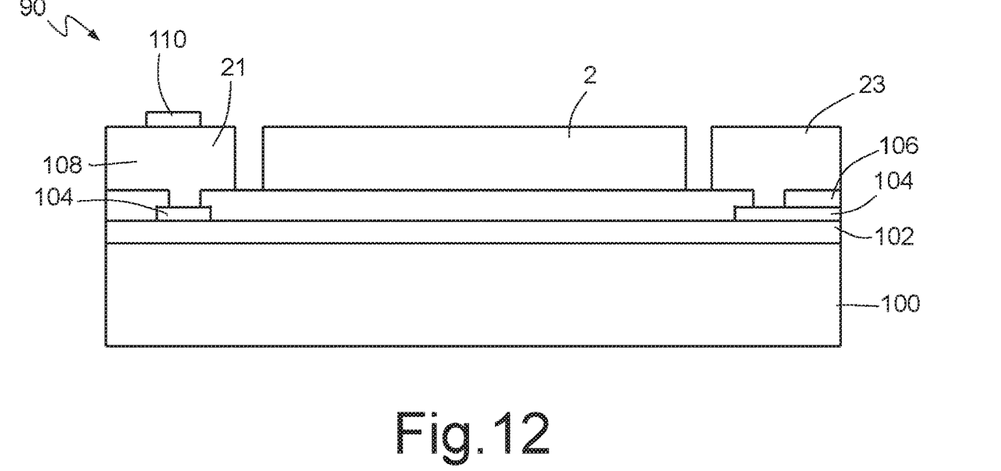

There then follows (FIG. 12), a selective etching of the epitaxial layer 108 in order to define the desired shape of the mobile body 2 and of the arms 8 and 10, as well as of the top electrodes 21, 22 and bottom electrodes 23, 24. This is moreover followed, in a way not shown in the figure, by deposition of semiconductor material and metal, and corresponding photolithographic definition to form the insulating layers 30, 32, and the conductive layers 26, 28, 34, 35, 36, 37.

Figure 13:
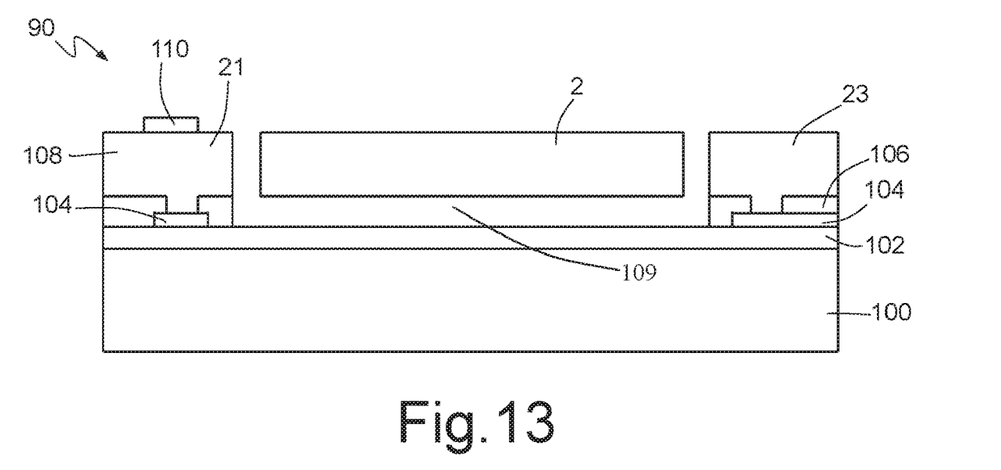

A step is then carried out (FIG. 13) of selective etching for removing the sacrificial layer 106 to release the mobile body 2 and the arms 8, 10, which are thus suspended over a cavity 109 and free to move (as also shown in FIG. 1).

Figure 14:
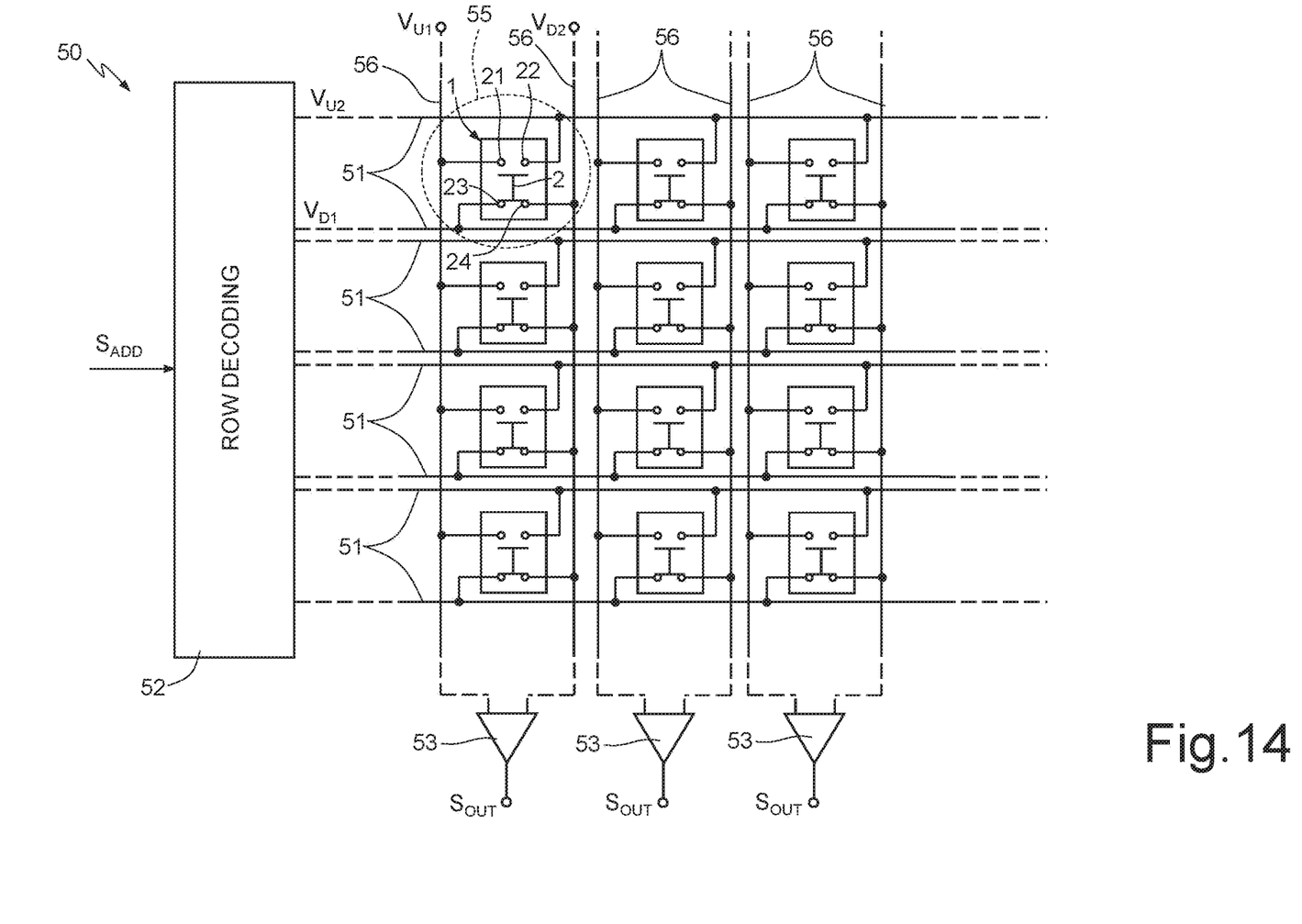
FIG. 14 shows a memory array including a plurality of microelectromechanical devices according to the present disclosure, in which each microelectromechanical device forms a memory cell for storing a logic datum.

According to a further aspect of the present disclosure it is possible to organize a plurality of memory modules 1 of the type described previously in an array, to form a memory, a portion 50 of which is schematically illustrated in FIG. 14.

The memory 50 of FIG. 14 comprises a plurality of memory modules 1 operatively coupled to biasing lines for supplying the read/write voltages $V_{U1}, V_{U2}, V_{D1}, V_{D2}$ as illustrated previously. For this purpose, the voltage supply circuit can be implemented by a row decoder 52, which receives at input an address signal $S_{ADD}$ and selectively biases row lines 51 at the voltages $V_{U2}$ and $V_{D1}$ for implementing a read or write operation.

A plurality of comparators 53, operatively coupled to respective column lines 56, are configured for comparing with one another the voltages $V_{U1}, V_{D2}$ and supplying at output a respective signal $S_{OUT}$ indicating the logic datum stored by the memory module addressed.

In use, for example to read the memory module 1 identified by the circle 55, the voltages $V_{U2}$ and $V_{D1}$ assume a value $V_{read}$, chosen as illustrated previously. Compared reading of the currents present on the column lines 56 corresponding to the memory module selected supplies at output a signal $S_{OUT}$ that can be correlated to the logic datum stored.

From what has been described above, the advantages that the present disclosure affords are evident.

For example, when we consider application of the present disclosure as relay, there is obtained the advantage of having, unlike inductive relays of a known type, two stable memory positions that do not require supply of energy from outside to maintain them (relays of a known type have only one stable position).

Moreover, when we consider application of the present disclosure as memory module or cell, it may be noted that the memory cell is insensitive to temperature variations. In addition, the operation may be at a low voltage (the voltages necessary for modification of the state can be generated internally, but no high currents are required, and thus any possible integrated voltage boosters can be easily provided).

Moreover, the energy consumption in reading and modification is very low. Reading, in particular, which substantially consists in verifying the presence or absence of a physical contact (an on/off state), can be carried out at low voltage values with low currents.

Finally, the number of reading and writing cycles does not generate phenomena of ageing present in non-volatile memories according to the prior art.

Finally, it is clear that modifications and variations may be made to what has been described and illustrated herein, without thereby departing from the scope of the present disclosure.

In particular, the microelectromechanical device 1 can be used for applications other than storage of logic states, and in particular can be used as a relay. In this case, the relay is an open switch when the mobile mass 2 is at a distance both from the top electrodes 21, 22 and from the bottom electrodes 23, 24 (resting condition, in which no forces act on the mobile mass 2). When, instead, the mobile mass 2 is in direct contact with the top electrodes 21, 22, the relay is a closed switch, in so far as the conductive layer 26 forms a conductive path between the electrode 21 and the electrode 22. Likewise, also when the mobile mass 2 is in direct contact with the bottom electrodes 23, 24, the relay is a closed switch, in so far as the conductive layer 28 forms a conductive path between the electrode 23 and the electrode 24. Passage between the state of closed circuit and the state of open circuit occurs by generating an electrostatic force by an appropriate voltage, in a way similar to what has been described previously for movement of the mobile mass 2. Use of the relay according to the present disclosure is advantageous in so far as both in conditions of open circuit and in conditions of closed circuit the relay does not require supply in so far as, in the absence of external supply, it remains in the chosen state.

Figure 15:
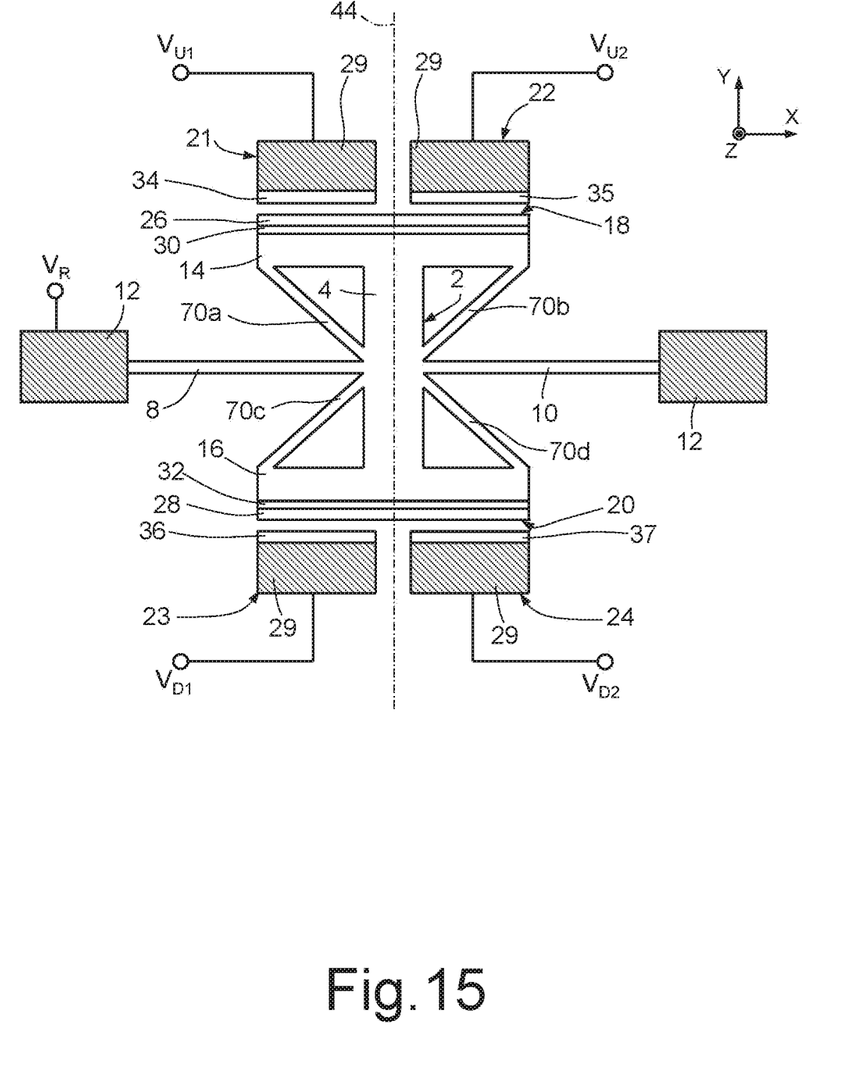
FIG. 15 shows, in a view in the plane XY, a microelectromechanical device according to a further aspect of the present disclosure.

Moreover, the structures of the memory module or relay according to the present disclosure (illustrated, for example, in FIGS. 1-3) can be improved from the standpoint of stiffness by envisaging the formation of "tierods" 70a-70d that extend between each end 8a, 10a of the first and second arms 8, 10 towards a peripheral (edge) region of the top coupling portion 14 and of the bottom coupling portion 16 to form, in a view in the plane XY, an X-shaped tierod structure, of the type illustrated in FIG. 15.

It should be appreciated that the use of the terms "top" and "bottom" is for exemplary purposes only, in view of the depictions in the drawings. One could orient the devices in any way without departing from the present disclosure. For example, the devices could be rotated ninety degrees such that the top and bottom electrodes become left and right lateral electrodes or they could be flipped 180 degrees such that the top and bottom electrodes become bottom and top electrodes, respectively.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical device, comprising:
    a mobile body configured to move in a direction, and including a first coupling region and a second coupling region;
    a first arm and a second arm suspending the mobile body over a cavity;
    a first electrode and a second electrode, directly facing the first coupling region and electrically insulated from one another; and
    a third electrode and a fourth electrode, directly facing the second coupling region and electrically insulated from one another, wherein:
    said mobile body is, in a resting condition, at a distance from the first and second electrodes and from the third and fourth electrodes,
    the mobile body, the first and second electrodes, and the third and fourth electrodes are configured to be electrically biased into generating a movement of the mobile body in said direction for causing, in a first operating condition, a direct contact of the first coupling region with the first and second electrodes and, in a second operating condition, a direct contact of the second coupling region with the third and fourth electrodes,
    the first coupling region and the first and second electrodes are configured, in the first operating condition and in the absence of electrical biasing, to remain in stable mutual contact as a result of molecular-attraction forces, and
    the second coupling region and the third and fourth bottom electrodes are configured, in the second operating condition and in the absence of electrical biasing, to remain in stable mutual contact as a result of molecular-attraction forces, and
    the first arm and the second arm are configured to exert, on the mobile body in the first and second operating conditions, an elastic force that tends to bring the mobile body back into the resting condition.

2. The microelectromechanical device according to claim 1, wherein the elastic force is lower, in modulus, than said molecular-attraction forces that act between the first coupling region and the first and second electrodes in the first operating condition and between the second coupling region and the third and fourth electrodes in the second operating condition.

3. The microelectromechanical device according to claim 1, comprising a read circuit configured to:
    in the first operating condition, bias one of the third and fourth electrodes at a read voltage and bias the other of the third and fourth electrodes at a ground reference voltage, to generate, on the mobile body, a force with a direction opposite to the molecular-attraction forces in the first operating condition and a value, in modulus, lower than a value of the molecular-attraction forces in the first operating condition; and in the second operating condition, bias one of the first and second electrodes at the read voltage, and bias the other of the first and second electrodes at the ground reference voltage, to generate, on the mobile body, a force with a direction opposite to the molecular-attraction forces in the second operating condition and a value, in modulus, lower than a value of the molecular-attraction forces in the second operating condition.

4. The microelectromechanical device according to claim 1, comprising a voltage supply circuit configured to:

in the first operating condition, bias at least one of the third and fourth electrodes at a write voltage to generate, on the mobile body, a force in a direction opposite to the molecular-attraction forces in the first and second and a value, in modulus, greater than the molecular-attraction forces in the first and operating condition; and in the second operating condition, bias at least one of the first and second electrodes at the write voltage to generate, on the mobile body, a force in a direction opposite to the molecular-attraction forces in the second operating condition and a value, in modulus, greater than the molecular-attraction forces in the second operating condition.

5. The microelectromechanical device according to claim 1, wherein:

the first coupling region includes a first conductive layer that, in the first operating condition, is in direct contact with both of the first and second electrodes; and the second coupling region includes a second conductive layer that, in the second operating condition, is in direct contact with both of the third and fourth electrodes.

6. The microelectromechanical device according to claim 5, wherein:

the mobile body includes a main portion connecting the first and second coupling regions to each other, the main portion being of semiconductor material;

the first coupling region includes a first insulating layer positioned between the first conductive layer and the main portion, the first insulating layer electrically insulating the main portion from the first conductive layer; and the second coupling region includes a second insulating layer positioned between the second conductive layer and the main portion, the second insulating layer electrically insulating the main portion from the second conductive layer.

7. The microelectromechanical device according to claim 1, wherein said mobile body and the first, second, third, and fourth electrodes form a memory cell, the microelectromechanical device comprising a read device configured read the first operating condition as a first logic datum stored by the memory cell and read the second operating condition as a second logic datum stored by the memory cell.

8. The microelectromechanical device according to claim 1, wherein said microelectromechanical device is a relay, the first and second operating conditions being respective closed-relay states, and the resting condition being an open-relay state.

9. The microelectromechanical device according to claim 1, wherein said molecular-attraction forces include the Casimir force.

10. A method for manufacturing a microelectromechanical device, comprising:

forming a mobile body configured to move in a direction, the mobile body including a first coupling region and a second coupling region;

forming a first arm and a second arm suspending from the mobile body over a cavity;

forming a first electrode and a second electrode directly facing the first coupling region and electrically insulated from one another;

forming a third electrode and a fourth electrode directly facing the second coupling region and electrically insulated from one another;

arranging said mobile body in a resting condition, at a distance from the first and second electrodes and from the third and fourth electrodes, wherein the mobile body, the first and second electrodes, and the third and fourth electrodes are configured to be electrically biased into generating a movement of the mobile body in said direction for causing, in a first operating condition, a direct contact of the first coupling region with the first and second electrodes and, in a second operating condition, a direct contact of the second coupling region with the third and fourth electrodes, the first coupling region and the first and second electrodes are configured, in the first operating condition and in the absence of electrical biasing, to remain in stable mutual contact as a result of molecular-attraction forces, the second coupling region and the third and fourth bottom electrodes are configured, in the second operating condition and in the absence of electrical biasing, to remain in stable mutual contact as a result of molecular-attraction forces, and the first arm and the second arm are configured to exert, on the mobile body in the first and second operating conditions, an elastic force that tends to bring the mobile body back into the resting condition.

11. The method according to claim 10, wherein:

the elastic force is lower, in modulus, than said molecular-attraction forces that act between the first coupling region and the first and second electrodes in the first operating condition and between the second coupling region and the third and fourth electrodes in the second operating condition.

12. The method according to claim 10, further comprising:

forming a read circuit configured to:

in the first operating condition, bias one of the third and fourth electrodes at a read voltage and bias the other of the third and fourth electrodes at a ground reference voltage, to generate, on the mobile body, a force with a direction opposite to the molecular-attraction forces in the first operating condition and a value, in modulus, lower than a value of the molecular-attraction forces in the first operating condition; and in the second operating condition, bias one of the first and second electrodes at the read voltage, and bias the other of the first and second electrodes at the ground reference voltage, to generate, on the mobile body, a force with a direction opposite to the molecular-attraction forces in the second operating condition and a value, in modulus, lower than a value of the molecular-attraction forces in the second operating condition.

13. The method according to claim 10, further comprising:
forming a voltage supply circuit configured to:
in the first operating condition, bias at least one of the third and fourth electrodes at a write voltage to generate, on the mobile body, a force in a direction opposite to the molecular-attraction forces in the first and second and a value, in modulus, greater than the molecular-attraction forces in the first and operating condition, and
in the second operating condition, bias at least one of the first and second electrodes at the write voltage to generate, on the mobile body, a force in a direction opposite to the molecular-attraction forces in the second operating condition and a value, in modulus, greater than the molecular-attraction forces in the second operating condition.

14. The method according to claim 10, wherein:
the first coupling region includes a first conductive layer that, in the first operating condition, is in direct contact with both of the first and second electrodes, and
the second coupling region includes a second conductive layer that, in the second operating condition, is in direct contact with both of the third and fourth electrodes.

15. The method according to claim 14, wherein:
the mobile body includes a main portion connecting the first and second coupling regions to each other, the main portion being of semiconductor material;
the first coupling region includes a first insulating layer positioned between the first conductive layer and the main portion, the first insulating layer electrically insulating the main portion from the first conductive layer; and
the second coupling region includes a second insulating layer positioned between the second conductive layer and the main portion, the second insulating layer electrically insulating the main portion from the second conductive layer.

16. The method according to claim 10, further comprising:
forming a memory cell using said mobile body and the first, second, third, and fourth electrodes;
forming a read device included in the microelectromechanical device configured to read the first operating condition as a first logic datum stored by the memory cell and read the second operating condition as a second logic datum stored by the memory cell.

17. The method according to claim 10, wherein said microelectromechanical device is a relay, the first and second operating conditions being respective closed-relay states, and the resting condition being an open-relay state.

18. The method according to claim 10, wherein said molecular-attraction forces include the Casimir force.

19. A microelectromechanical device, comprising:
a mobile body configured to move in a direction, and including having a main portion, a first coupling region at a first end of the main portion, and a second coupling region at a second end of the main portion opposite of the first end, wherein a central portion of the first coupling region is connected at the first end and a central portion of the second coupling region is connected at the second end;
a first electrode and a second electrode, directly facing the first coupling region and electrically insulated from one another; and
a third electrode and a fourth electrode, directly facing the second coupling region and electrically insulated from one another;
a first set of tierods extending from the main portion to a peripheral portion of the first coupling region; and
a second set of tierods extending from the main portion to a peripheral portion of the second coupling region.

20. The microelectromechanical device according to claim 19, further comprising a first arm and a second arm suspending the mobile body over a cavity and configured to exert a first elastic force that moves the mobile body towards the first and second electrodes, and a second elastic force that moves the mobile body towards the third and fourth electrodes,
wherein the first set of tierods extends from the peripheral portion of the first coupling region to the first arm and the second arm, and the second set of tierods extends from the peripheral portion of the second coupling region to the first arm and the second arm.

* * * * *

UNITED STATES PATENT AND TRADEMARK OFFICE
CERTIFICATE OF CORRECTION

PATENT NO. : 10,847,326 B2
APPLICATION NO. : 16/453737
DATED : November 24, 2020
INVENTOR(S) : Giovanni Campardo et al.

Page 1 of 1

It is certified that error appears in the above-identified patent and that said Letters Patent is hereby corrected as shown below:

In the Claims

Column 12, Line 45, Claim 1:
"bottom electrodes" should read, --electrodes--.

Column 14, Line 32, Claim 10:
"bottom electrodes" should read, --electrodes--.

Signed and Sealed this
Fifth Day of January, 2021

Andrei Iancu
*Director of the United States Patent and Trademark Office*